United States Patent
Benedict et al.

(10) Patent No.: US 11,474,706 B2
(45) Date of Patent: Oct. 18, 2022

(54) MEMORY ACCESS RATE

(71) Applicant: HEWLETT PACKARD ENTERPRISE DEVELOPMENT LP, Houston, TX (US)

(72) Inventors: Melvin K. Benedict, Houston, TX (US); Eric L. Pope, Houston, TX (US); Andrew C. Walton, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 665 days.

(21) Appl. No.: 14/786,383

(22) PCT Filed: Apr. 30, 2013

(86) PCT No.: PCT/US2013/038830
§ 371 (c)(1),
(2) Date: Oct. 22, 2015

(87) PCT Pub. No.: WO2014/178839
PCT Pub. Date: Nov. 6, 2014

(65) Prior Publication Data
US 2016/0085466 A1    Mar. 24, 2016

(51) Int. Cl.
*G06F 3/06* (2006.01)
*G11C 11/406* (2006.01)
(Continued)

(52) U.S. Cl.
CPC .......... *G06F 3/0619* (2013.01); *G06F 3/0653* (2013.01); *G06F 3/0673* (2013.01);
(Continued)

(58) Field of Classification Search
CPC .... G06F 3/0619; G06F 3/0653; G06F 3/0673; G11C 11/406
See application file for complete search history.

(56) References Cited

U.S. PATENT DOCUMENTS 3,303,481 A  *  2/1967  Kessler ............ G11C 11/06035
                                                  365/209
5,630,097 A     5/1997  Orbits et al.
(Continued)

FOREIGN PATENT DOCUMENTS

CN      1613064 A       5/2005
CN      1284086         11/2006
(Continued)

OTHER PUBLICATIONS

Huang, Rei-Fu. et al., "Alternate Hammering Test for Application-specific DRAMs and an Industrial Case Study", (Research Paper), Jun. 3-7, 2012, pp. 1012-1017.
(Continued)

*Primary Examiner* — Arpan P. Savla
*Assistant Examiner* — Eric T Loonan
(74) *Attorney, Agent, or Firm* — Hewlett Packard Enterprise Patent Department

(57) ABSTRACT

A technique includes determining, via an analog circuit, where an access rate of a memory row associated with a memory device exceeds a threshold. In various examples, upon a determination that the access rate exceeds the threshold, the technique may further comprise generating an alert to indicate possible corruption of data stored in an adjacent row to the memory row.

20 Claims, 5 Drawing Sheets

(51) Int. Cl.
  *G11C 7/02* (2006.01)
  *G11C 29/02* (2006.01)
  *G11C 11/408* (2006.01)
  *G11C 7/10* (2006.01)
  *G11C 29/04* (2006.01)

(52) U.S. Cl.
  CPC .............. *G11C 7/02* (2013.01); *G11C 7/1063* (2013.01); *G11C 11/406* (2013.01); *G11C 11/4085* (2013.01); *G11C 29/023* (2013.01); *G11C 29/028* (2013.01); *G11C 2029/0409* (2013.01); *G11C 2211/4065* (2013.01); *G11C 2211/4068* (2013.01)

(56) References Cited

U.S. PATENT DOCUMENTS

| | | |
|---|---|---|
| 5,717,644 A | 2/1998 | Hadderman et al. |
| 5,745,913 A | 4/1998 | Pattin et al. |
| 6,005,810 A | 12/1999 | Wu |
| 6,169,687 B1 * | 1/2001 | Johnson .................. G11C 11/16 365/158 |
| 6,651,141 B2 | 11/2003 | Adrangi |
| 6,681,297 B2 | 1/2004 | Chauvel et al. |
| 6,836,443 B2 | 12/2004 | Dadashev |
| 7,193,901 B2 | 3/2007 | Ruby et al. |
| 7,233,538 B1 | 6/2007 | Wu et al. |
| 7,405,964 B2 | 7/2008 | Philipp et al. |
| 7,808,831 B2 | 10/2010 | Mokhlesi et al. |
| 7,831,773 B2 | 11/2010 | Zedlewski et al. |
| 7,995,386 B2 | 8/2011 | Mizuguchi et al. |
| 8,108,596 B2 | 1/2012 | Aldworth et al. |
| 8,108,609 B2 | 1/2012 | Barth et al. |
| 8,166,248 B2 | 4/2012 | Provenzano et al. |
| 8,190,842 B2 | 5/2012 | Frost et al. |
| 8,200,902 B2 | 6/2012 | Paver et al. |
| 8,320,185 B2 | 11/2012 | Marquart |
| 8,332,576 B2 | 12/2012 | Chu et al. |
| 8,347,176 B2 | 1/2013 | Resnick et al. |
| 8,406,038 B2 | 3/2013 | Saito et al. |
| 8,788,758 B1 | 7/2014 | de la Iglesia |
| 8,806,137 B2 | 8/2014 | Rabinovitch et al. |
| 9,804,972 B2 | 10/2017 | Benedict et al. |
| 9,940,286 B2 | 4/2018 | Duluk, Jr. et al. |
| 2002/0065992 A1 | 5/2002 | Chauvel et al. |
| 2002/0087797 A1 | 7/2002 | Adrangi |
| 2004/0218439 A1 | 11/2004 | Harrand et al. |
| 2006/0083094 A1 | 4/2006 | Sinha et al. |
| 2008/0259708 A1 | 10/2008 | Tsukazaki et al. |
| 2009/0144492 A1 | 6/2009 | Barth et al. |
| 2009/0187713 A1 | 7/2009 | Zedlewski et al. |
| 2009/0319718 A1 | 12/2009 | Aldworth et al. |
| 2010/0091586 A1 | 4/2010 | Carman |
| 2010/0106901 A1 * | 4/2010 | Higeta .................. G11C 11/406 711/106 |
| 2011/0307664 A1 | 12/2011 | Paver et al. |
| 2012/0054374 A1 | 3/2012 | Carter et al. |
| 2012/0191900 A1 | 7/2012 | Kunimatsu et al. |
| 2012/0246544 A1 | 9/2012 | Resnick et al. |
| 2012/0272029 A1 | 10/2012 | Zhang et al. |
| 2012/0324172 A1 | 12/2012 | Rabinovitch et al. |
| 2014/0156923 A1 * | 6/2014 | Bains .................. G11C 11/4078 711/106 |
| 2014/0281110 A1 | 9/2014 | Duluk, Jr. et al. |

FOREIGN PATENT DOCUMENTS

| | | |
|---|---|---|
| CN | 101796497 A | 8/2010 |
| CN | 102841856 A | 12/2012 |
| EP | 0895162 A2 | 2/1999 |
| EP | 2169558 A1 | 3/2010 |
| KR | 10-2012-0100705 A | 9/2012 |

OTHER PUBLICATIONS

International Search Report and Written Opinion dated Jan. 27, 2014, issued on PCT Patent Application No. PCT/US2013/038830 dated Apr. 30, 2013, Korean Patent Office.

Extended European Search Report dated Nov. 7, 2016; EP Application No. 13883675.4; pp. 10.

Benedict et al., "Word Line Guard Band," May 2013, Research Disclosure, p. 614.

Ghosh, M. et al., "Smart Refresh: An Enhanced Memory Controller Design for Reducing Energy in Conventional and 3D Die-Stacked DRAMs," 2007, 40th IEEE/ACM Int'l Symposium on Microarchitecture, pp. 134-145.

Yoon, H et al., "A Row Buffer Locality-Aware Caching Policy for Hybrid Memories," Dec. 17, 2011, Research Paper, https://research.ece.cmu.edu/safari/pubs/rbla_nvmw201 2_abstract.pdf.

* cited by examiner

MEMORY ACCESS RATE

CLAIM FOR PRIORITY

The present application is a national stage filing under 35 U.S.C. § 371 of PCT application number PCT/US2013/038830, having an international filing date of Apr. 30, 2013, the disclosure of which is hereby incorporated by reference in its entirety.

BACKGROUND

A memory device includes memory cells to store data values. An example type of memory device is a dynamic random access memory (DRAM) device. As memory manufacturing technology has advanced, the feature size of memory cells has decreased to increase the density of memory cells in a memory device. Increasing the memory cell density provides increased storage capacity in the memory device.

DETAILED DESCRIPTION

Processing a massive dataset may be quite burdensome on a memory of a computer system due to a large number of potential repeated accesses to the same or nearby memory locations in connection with this processing. The repeated accesses may be at rates that are large enough to potentially affect the integrity of the data stored in the memory.

More specifically, charges are selectively stored in the capacitor-based memory cells of a dynamic random access memory (DRAM) device to represent the corresponding stored data. Because leakage currents degrade the stored charges, the memory cells of the DRAM device are periodically refreshed, which involves reading the data stored in the DRAM's device memory cells and rewriting the data back to the memory cells. The rate at which the DRAM device is refreshed, however, may be insufficient to maintain the charge levels for certain activity. In this manner, for purposes of accessing a row of memory cells of a DRAM device, a command called an "activate command" may be issued to open the row for access.

Repeated activation of a given row (activations on the order of thousands of times per refresh period, for example) at a high enough rate may degrade data stored in adjacent word lines (a natural occurrence in the DRAM due to the relatively close spacing of the DRAM features), even though these word lines are periodically refreshed. In other words, the periodic refresh intervals may be insufficient to maintain the stored data when the activation rates exceed a certain threshold.

For purposes of controlling the degradation that may otherwise occur due to repeated activations of a given row during a given refresh period, systems and techniques are disclosed herein, which use analog circuitry to monitor activation or access rates and generate alerts for frequently accessed DRAM rows.

More specifically, systems and techniques are disclosed herein for monitoring the activation rates or access rates of memory rows. Upon an access rate exceeding a predetermined threshold, the memory row address may be stored in a register and an alert transmitted to a memory controller. The memory controller may then refresh selected rows including but not limited to any adjacent rows to the memory row stored in the register. In an alternate example, upon the access rate exceeding a predetermined threshold, the DRAM can institute an appropriate refresh of any impacted rows. This may occur without the use of an external memory controller.

Figure 1:
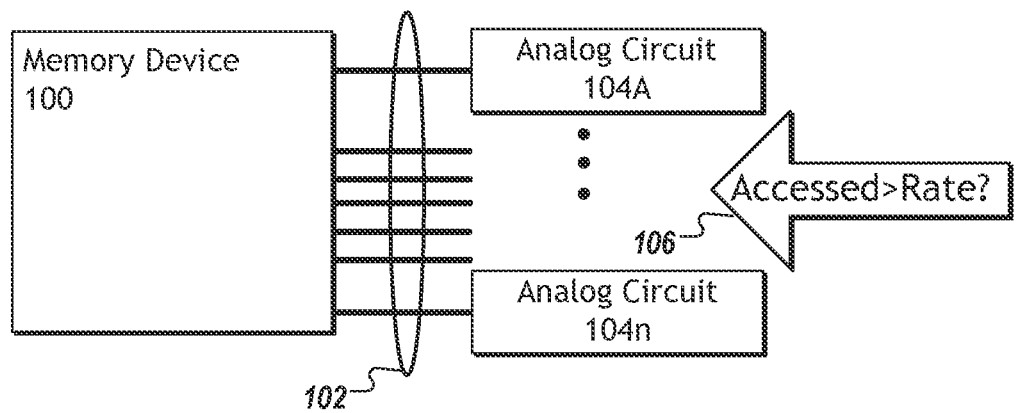
FIG. 1 is a block diagram of a system in accordance with one example of the present disclosure.

Referring to FIG. 1, a block diagram of a system is illustrated in accordance with an example of the present disclosure. The system includes a memory device 100 comprising a plurality of word lines 102. The word lines 102 may be individually coupled to respective analog circuits 104A-n. The analog circuits 104A-n, in this example, are configured to determine whether their respective word line has been accessed at least at a predetermined rate between refreshes.

Memory device 100 may be any device comprising an array of word lines and bit lines. For the purposes of this disclosure, the memory devices discussed in the figures will be referred to as Dynamic Random Access Memory (DRAM), however, the disclosure is not so limited.

Analog circuit 104A-n may comprise various combinations of analog components, including but not limited to, resistors, capacitors, transistors, diodes, and others. These components may be utilized in various combinations to facilitate detection of a hammered row. As used herein a hammered row is a row that has been accessed at a rate that impacts the ability of adjacent rows to maintain data.

In the illustrated example, the memory device 100 includes as plurality of word lines. Word lines are the horizontal lines within the memory array that form junctions with the vertical bit lines. At each junction various components are disposed to store a charge which represents one or more bits of data. Each word line may be accessed at varying rates in accordance with a need to retrieve specific data. Receiving too many accesses or activations may cause degradation in adjacent rows thereby impacting the memory device 100.

While illustrated as distinct components, the memory device 100 and the analog circuits 104A-n may alternatively be combined and packaged as a single device, for example, a single DRAM device. While the remainder of the disclosure will discuss various examples in which the components may be discussed independently of each other and/or illustrated as separate components, the disclosure is not so limited.

Figure 2:
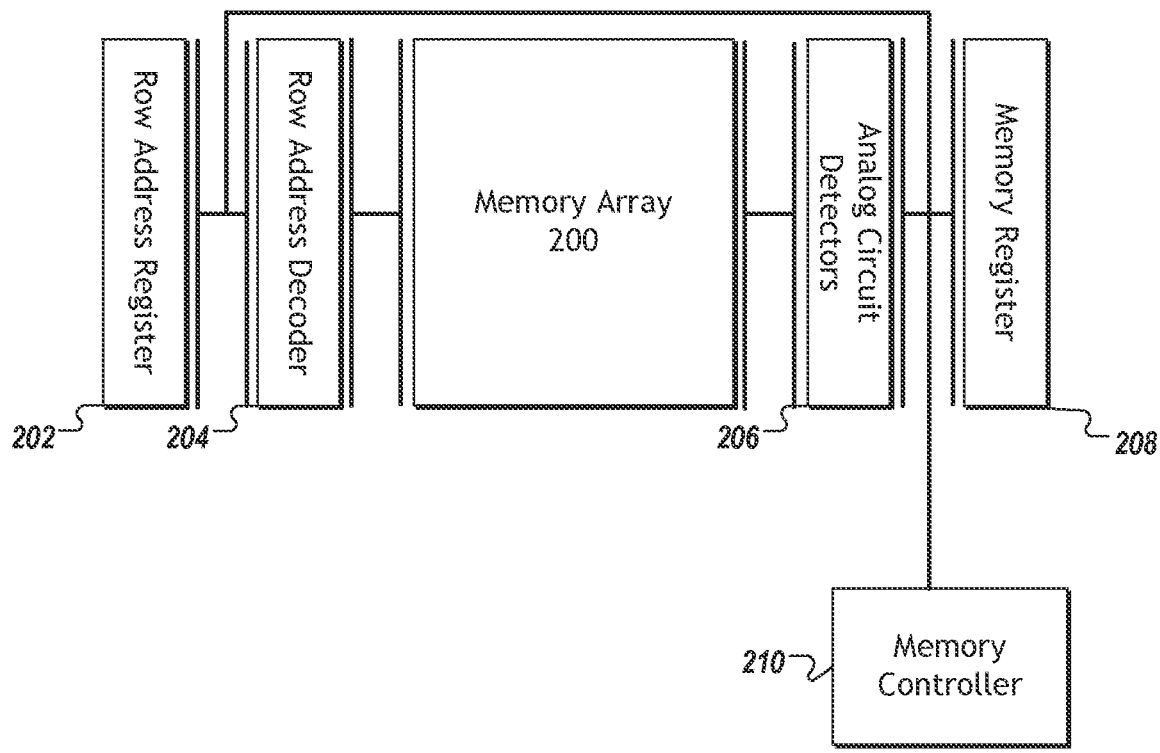
FIG. 2 is a block diagram of a system in accordance with one example of the present disclosure.

Referring to FIG. 2, another system is illustrated in accordance with the present disclosure. The system includes a memory device having a row address register 202, a row address decoder 204, a memory array 200, a plurality of analog circuit detectors 206, a memory register 208, and a memory controller 210.

In the illustrated example, the row address register may receive a plurality of requests for data being stored in various rows of the memory array 200. The row address register 200 may pass the request to the row address decoder 204 may which may charge or access the requested row within the memory array 200. As multiple accesses are made to a particular row within the memory array 200, an analog circuit detector 206 coupled to the row may determine whether its respective word line or row has been accessed at least at a predetermined rate between refreshes.

Assuming, for example, that the word line or row has been accessed at least at the predetermined rate, which may be approximately $3.1e^6$ accesses within a period of approximately 64 milliseconds, the analog circuit detector 206 coupled to the respective word line 208 may send an alert to the memory controller 210. The alert, in various examples, may be either a high or low logic signal.

A memory register 208 may be coupled to each of the analog circuit detectors 206. In addition, to sending an alert to the memory controller 210, the analog circuit detector 206 may trigger the particular row address which was accessed at least at the predetermined rate to be stored within the memory register 208. Consequently, the memory register 208 may store the address associated with the word line that the analog circuits 206 determines has been accessed at the predetermined rate between refreshes.

Upon receipt of the alert, the memory controller 210 may command the memory array 200 to activate the word lines impacted by the hammered row. In various examples, this may include a refresh of the hammered row, and/or one or more adjacent rows. As used herein an adjacent row is any row impacted by the repeated accesses of the hammered row. Upon refresh of the rows, the memory controller 210 may reset the analog circuit detectors and flush the memory register 208.

Figure 3:
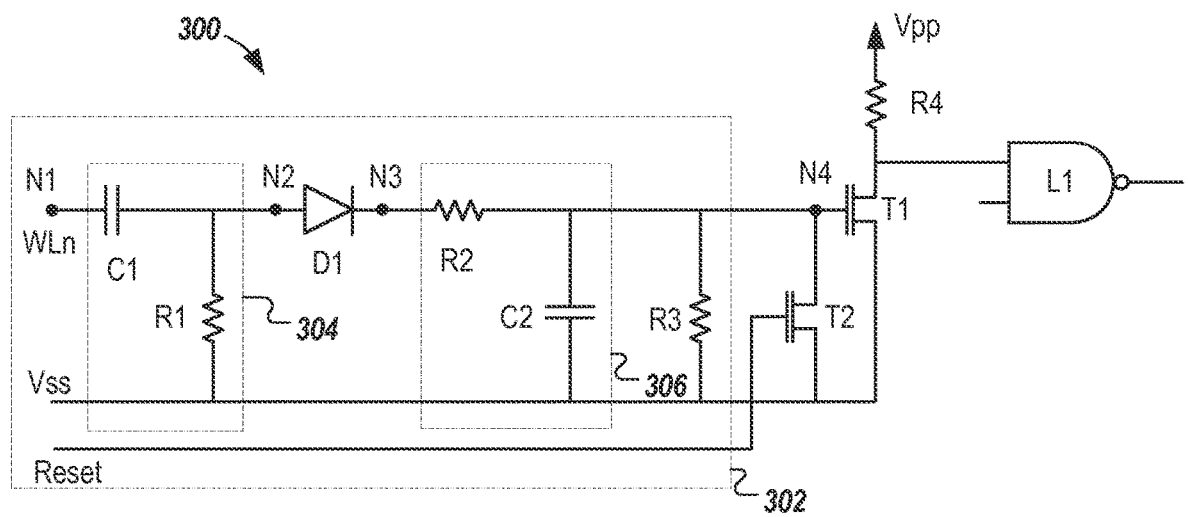
FIG. 3 is a circuit diagram illustrating an example of an analog circuit in accordance with the present disclosure.

Referring to FIG. 3 a circuit diagram of one example of an analog circuit is illustrated. The analog circuit 300 includes a bandpass filter 302, a plurality of transistors T2 and T1, and a logic gate L1. The analog circuit 300 is coupled to an individual word line, in the illustrated example, word line n (WLn). The components of the analog circuit are determined and selected to generate an alert upon an activation or access rate exceeding a threshold.

The analog circuit 300 includes a bandpass filter 302. The bandpass filter is further composed of a differentiator 304, a diode D1, and an integrator 306. Each of the differentiator 304 and integrator 306 further comprise additional analog components including resistors and capacitors. The values of the various analog components are selected such that an activation or access rate will trigger an alert to a memory controller when it reaches or exceeds a threshold. The analog circuit 300 also includes a first field effect transistor (FET) T2, a second FET T1 and a logic gate L1 including a NAND circuit. The bandpass filter 302 is connected to the gate of the second FET T1 at a node N4 wherein the drain of the first FET T2 is connected to the gate of the second FET T1. An input of the logic gate L1 is connected to the drain of the second FET T1. A reset voltage from the bandpass filter 302 is connected to the gate of the first FET T2 and a source voltage from the bandpass filter 302 is connected to a source of the second FET T1.

Figure 4:
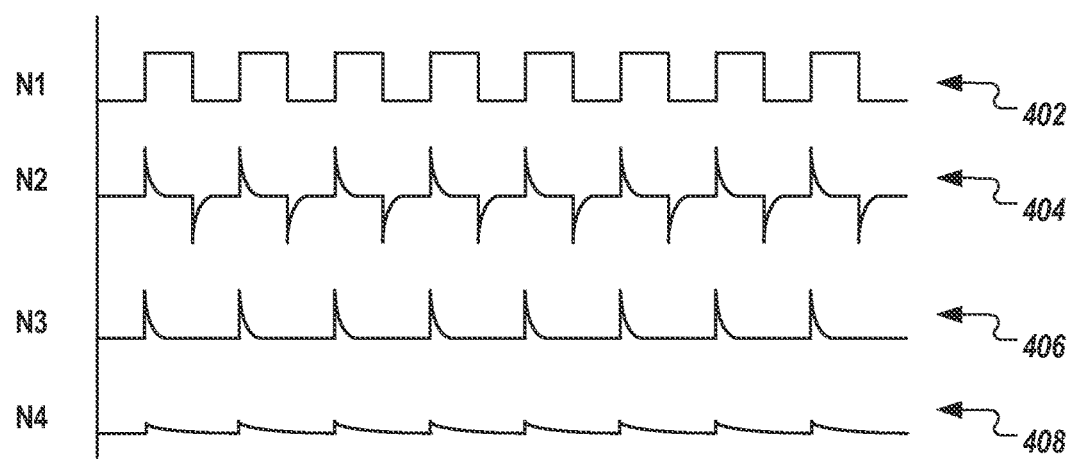
FIG. 4 illustrates a response of the circuit diagram of FIG. 3 to an access signal in accordance with an example of the present disclosure.

With reference to FIG. 3 and FIG. 4, an illustrative example and response of an analog circuit 300 to an access rate above a threshold is discussed. As mentioned previously, analog circuit 300 is one of many analog circuits coupled to the plurality of word lines. For simplicity the discussion will reference a single word line, WLn.

Node N1 is coupled directly to the word line WLn, and as such receives a signal whenever WLn is accessed. As seen in FIG. 4, a signal 402 having repeated accesses is illustrated. The signal 402 is provided to the analog circuit 300 and mores specifically the row access pulses 402 are passed to a differentiator 304 comprising capacitor C1 and resistor R1. Differentiator 304 functions generically as a high pass filter which converts the edges of the row access pulses of row access signal 402 to pulses.

With reference to node N2, the row access signal has been processed through a high pass filter (e.g., the differentiator 304) to form a signal as seen in signal 404. The plurality of pulses from both positive and negative pulses. To filter the negative pulses, or conversely, to select the positive pulses associated with the positive transitions of the word line, diode D1 is coupled to node N2. The output of diode D1 is illustrated as signal 406.

With the negative transitions associated with the negative transitions of the word lines filtered, signal 406 is input into an integrator 306. Integrator 306 comprises components R2 and C2. An integrator 306 functions generically as a low pass filter. The integrator 306 and the components therein are selected such that if the row access signals exceed a predetermined threshold, the capacitor C2 builds up a sufficient charge to meet the gate voltage of transistor T1. In other words, the integrator 306 is to determine whether the pulses associated with the positive transitions of the word line access signals exceeds the predetermined threshold.

As seen in FIG. 4, at node N4, the signal 408 may build or dissipate dependent upon the frequency of access requests for the word line WLn. This is a consequence of the values selected for R2, R3, and C2. Upon building up to a threshold voltage, T1 may turn on and lower the voltage into logic gate L1. Logic gate L1 is illustrated as a NAND gate, but may comprise other logic dependent upon the use of high or low logic to generate alerts. In this instance, a low signal may effectively force the outcome of L1 high, thereby signaling an alert for WLn. Once triggered, the memory controller, not illustrated, may poll the memory register and retrieve one or more row addresses that have been hammered.

Once triggered, a memory controller may refresh the memory array and rest the analog circuit 300. Resetting the analog circuit 300 may comprise use of a reset line tied to transistor T2. Once triggered, the gate voltage on transistor T2 may dissipate thereby resetting the circuit an initial state.

Figure 5:
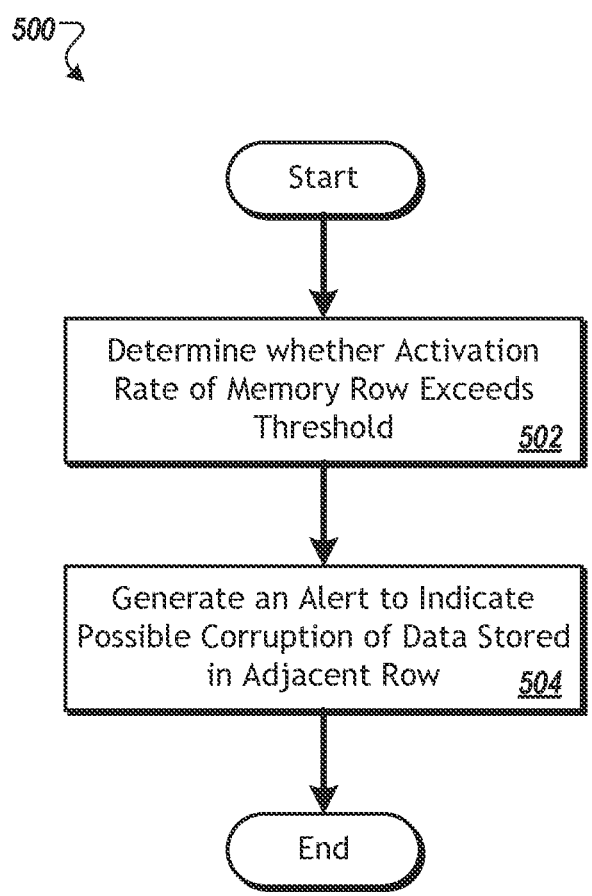
FIG. 5 illustrates a flow diagram in accordance with an example of the present disclosure.
Figure 6:
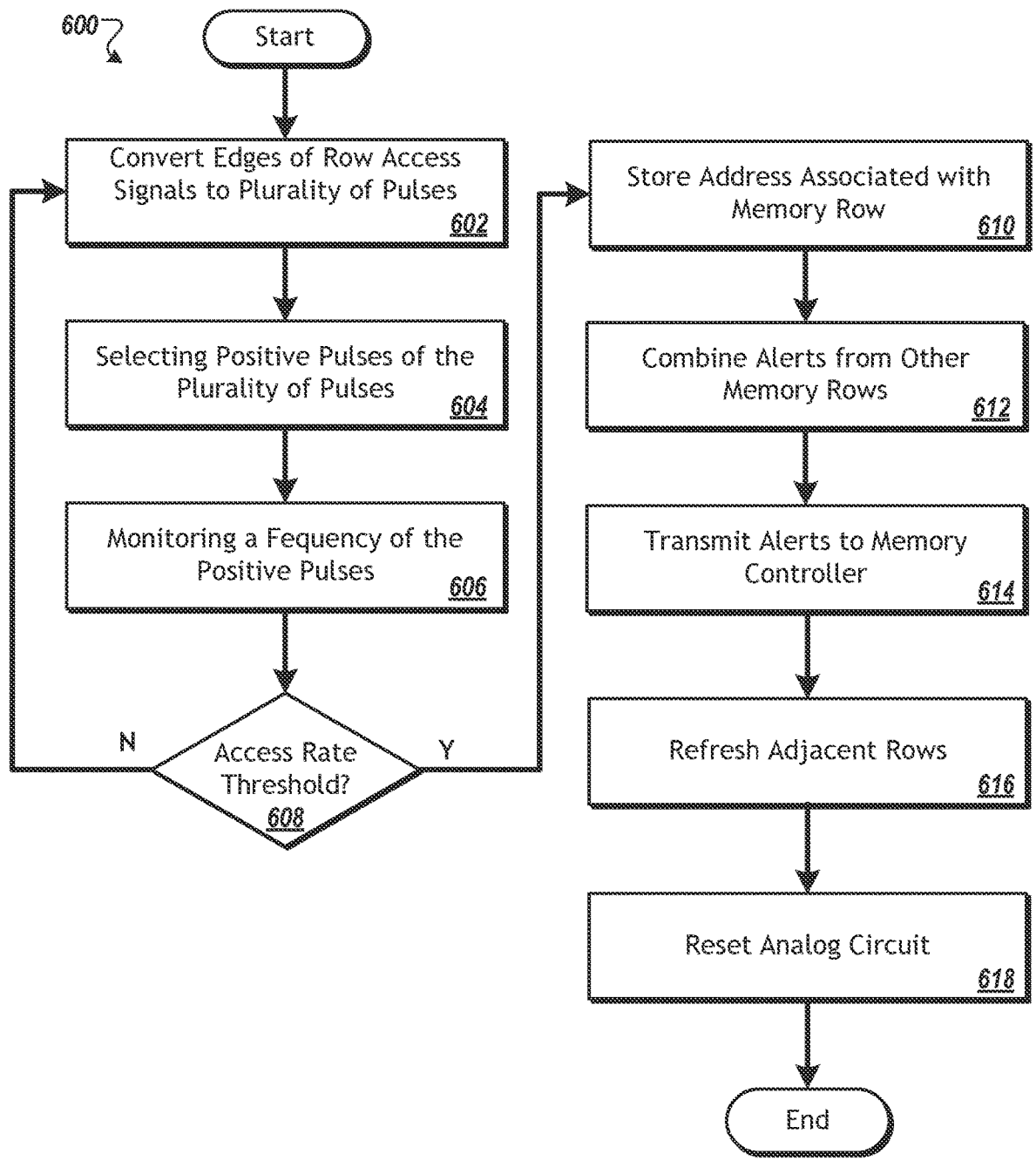
FIG. 6 illustrates a flow diagram in accordance with an example of the present disclosure.

Referring to FIGS. 5 and 6 flow diagrams are illustrated in accordance with examples of the present disclosure. The flow diagrams may illustrate various elements associated with the example systems described in the preceding Figures. The flow diagrams are merely exemplary are not meant to limit the present disclosure to any particular order or number of steps.

Referring to FIG. 5, the flow diagram 500 may begin and progress to 502 where a system such as that described with reference to FIGS. 1-3 may determine, via an analog circuit, whether an access rate of a memory row associated with a memory device exceeds a threshold. In various examples, the threshold may be determined such that meeting or exceeding it indicates a hammered row, or alternatively, the threshold may be determined such that meeting or exceeding it indicates a high likelihood of a hammered row.

In response to determining that the access rate exceeds the predetermined threshold, the analog circuit may generate an alert to indicate possible corruption of data stored in an adjacent row to the memory row at 504. The alert may be based on high or low logic signals. Upon generation of the alert at 504, the flow diagram may end.

Referring to FIG. 6, another example is illustrated in accordance with the present disclosure. The flow diagram 600 may begin and proceed to 602 where an analog circuit, such as a bandpass filter, may determine whether the access rate of a memory row associated with a memory device exceeds a threshold. The determination may include converting edges of row access signals to a plurality of pulses. At 604, the bandpass filter may select positive pulses from the plurality of pulses by filtering any negative pulses. As illustrated in FIG. 3, this may be accomplished via diode D1. Upon selecting of the positive pulses, the bandpass filter may monitor a frequency of the positive pulses at 606.

In monitoring the frequency of the positive pulses, a determination is made at 608 as to whether the average access rate exceeds the threshold. In one example, determining whether the access rate exceeds threshold comprises determining whether the access rate exceeds approximately $3.1e^6$ accesses within a refresh period of approximately 64 milliseconds. If the average access rate does not exceed the threshold, the flow diagram may return to 602. If the average access rate does exceed the threshold, flow diagram may continue to 610, where the row address associated with the memory row may be stored within a memory register, such as the memory register 208 of FIG. 2.

With the row address of the hammered memory row stored within the memory register at 610, a logic circuit may be utilized to combine alerts from other memory rows at 612. In one example, the alert may be combined with at least one other alert. The logic circuit utilized may be configured to indicate an error in response to one or more alert signals from one or more analog circuits. In the illustrated example of FIG. 3, a NAND gate is utilized. The combined alert may then be transmitted to a memory controller at 614. The memory controller may then poll the memory register for the one or more hammered rows and refresh any adjacent rows at 616. Upon refresh of any adjacent rows, the memory controller may reset the analog circuit at 618 and flush any row addresses from the memory register. The flow diagram may then end.

Figure 7:
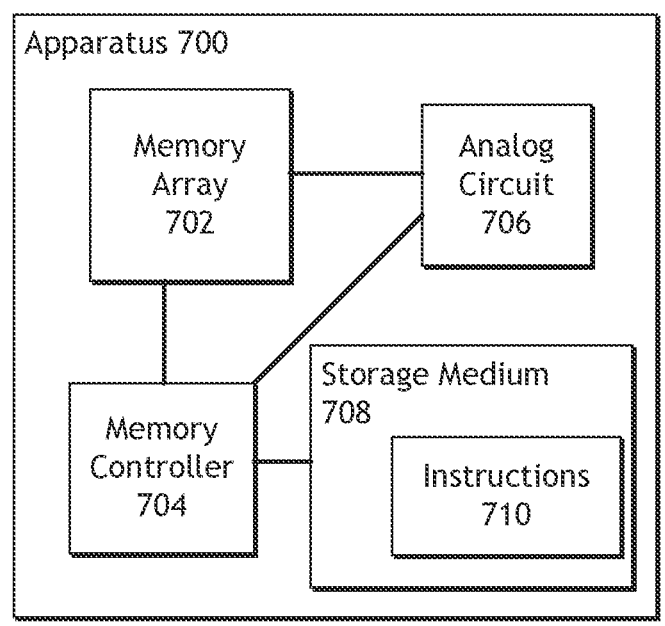
FIG. 7 illustrates a block diagram including a storage medium with instructions stored thereon in accordance with an example of the present disclosure.

Referring to FIG. 7, a block diagram of a system including a non-transitory storage medium having programing instructions stored thereon is illustrated in accordance with an example of the present disclosure. The system 700 includes a memory array 702 associated with a memory device. In addition, the system 700 includes a memory controller 704, an analog circuit 706, and the non-transitory storage medium 708 having instructions 710 stored thereon.

In the illustrated example, the memory controller 704 may be configured to read and execute instructions 710 stored on storage medium 708. While illustrated as distinct components, those of ordinary skill will readily understand that various components as illustrated may be incorporated into other components.

In accordance with FIG. 7, memory controller 704 may receive from analog circuit 706 an indication that a word line of memory array 702 has been accessed at least at a predetermined number of times within a refresh period. The analog circuit 706 may be a circuit as described with reference to the preceding figures. In response to the indication, the memory controller 704 may refresh an adjacent word line to the word line of the memory array to prevent a memory error. Refreshing the adjacent word line may comprise reading and writing the data of various cells associated with the adjacent word line.

Once various word lines have been refreshed, the memory controller 704 may be configured to reset the analog circuit. Resetting the analog circuit may comprise flushing one or more memory registers and discharging various voltages, for example, those voltages tied to the transistor gates of T1 in FIG. 3.

While a limited number of examples have been disclosed herein, those skilled in the art, having the benefit of this disclosure, will appreciate numerous modifications and variations therefrom. For example, as previous discussed it is expressly contemplated that various methodologies described herein may be implemented within individual components, for example, the DRAM itself. It is intended that the appended claims cover all such modifications and variations.

What is claimed is:

1. A method of managing a memory device including a plurality of word lines, wherein each word line is connected to a respective analog circuit of a plurality of analog circuits, the method comprising:
   converting, via a bandpass filter included in the respective analog circuit, edges of row access signals to a plurality of pulses, wherein the plurality of pulses include positive and negative pulses;
   selecting, via the bandpass filter, the positive pulses of the plurality of pulses;
   monitoring, via the bandpass filter, a frequency of the positive pulses of the plurality of pulses;
   determining, based on the monitoring via the analog circuit respectively coupled to a word line of the plurality of word lines, whether an access rate of a memory row associated with the word line exceeds a threshold between refreshes;
   generating, via the analog circuit, an alert that indicates possible corruption of data stored in an adjacent row to the memory row in response to a determination that the access rate exceeds the threshold;
   refreshing the adjacent row; and
   resetting the analog circuit.

2. The method of claim 1, wherein determining whether the access rate exceeds the threshold between refreshes comprises:
   determining, via the bandpass filter, whether the access rate of the memory row associated with the memory device exceeds 3.1e6 accesses per 64 milliseconds.

3. The method of claim 1, wherein monitoring, via the bandpass filter, the frequency of the positive pulses of the plurality of pulses comprises:
   determining, via the bandpass filter, that the frequency of positive pulses indicates an average access rate that exceeds the threshold between refreshes.

4. The method of claim 1, further comprising:
   storing, via the analog circuit, an address of the memory row in a memory register.

5. The method of claim 1, wherein the generating comprises:
   combining, via the analog circuit, the alert with at least another alert associated with another memory row; and
   transmitting the combined alerts to a memory controller.

6. A system comprising:
   a memory device comprising a plurality of word lines;
   a plurality of analog circuits, each analog circuit respectively including a bandpass filter and each analog circuit coupled to a respective word line of the plurality of word lines wherein a bandpass filter included in each of the analog circuits includes:
      a differentiator that converts edges of word line access signals to pulses that include positive and negative pulses;

a diode that enables selecting the positive pulses associated with positive transitions of the word line access signals; and an integrator that determines whether the pulses associated with the positive transitions of the word line access signals exceeds a predetermined threshold which is indicative of whether a respective word line has been accessed at least at a predetermined rate between refreshes;

a memory controller coupled to the memory device, wherein the memory controller commands the memory device to activate the word lines adjacent to the respective word lines that have been accessed at least at the predetermined rate, and the memory controller resets the analog circuits.

7. The system of claim 6, further comprising:
a memory register coupled to each of the analog circuits, wherein, for each of the analog circuits, the memory register is to store the address associated with the word line that the analog circuit determines has been accessed at least at the predetermined rate between refreshes.

8. The system of claim 6, wherein:
the diode is coupled to the differentiator and the integrator is coupled to the diode.

9. The system of claim 8, wherein the integrator comprises:
a plurality of components comprising values selected such that an average word line activation rate of greater than 3.1e6 word line access signals in 64 milliseconds is achieved.

10. The system of claim 6, further comprising:
a logic gate coupled to the analog circuit of each of the plurality of word lines, wherein the logic gate is to generate an aggregated signal indicating at least one word line has been accessed at least at the predetermined rate between refreshes.

11. The system of claim 6, wherein each of the plurality of analog circuits further comprises a plurality of transistors and a logic gate.

12. The system of claim 11, wherein a logic of the logic gate is based on use of a high or low logic to generate a signal indicative of the word line being accessed at least at the predetermined rate.

13. The system of claim 11, wherein the plurality of transistors comprise a first field effect transistor (FET) and a second FET and the logic gate includes a NAND gate and
the bandpass filter is connected to a gate of the second FET and a source of the first FET,
a drain of the first FET is connected to the gate of the second FET, and
an input of the NAND gate is connected to the second FET.

14. The system of claim 13, wherein a reset voltage from the bandpass filter is connected to the gate of the first FET and a source voltage from the bandpass filter is connected to the second FET and the first FET.

15. An article comprising:
a memory device including a plurality of word lines respectively coupled to a plurality of analog circuits, each analog circuit including:
a differentiator that converts edges of word line access signals to pulses that include positive and negative pulses;
a diode that enables selecting the positive pulses associated with positive transitions of the word line access signals; and
an integrator that determines whether a respective word line has been accessed at least at a predetermined rate between refreshes based on the pulses associated with the positive transitions of the word line access signals;
and
a non-transitory storage medium to store instructions readable by a processor-based system to control at least one of the plurality of word lines of the memory device, wherein the instructions are executable by the processor-based system to cause the processor-based system to:
receive, from the analog circuit respectively coupled to a word line of the plurality of word lines, an indication that the word line of the memory device has been accessed at least a predetermined number of times within a refresh period;
refresh an adjacent word line to the word line of the memory device to prevent a memory error; and
reset the analog circuit.

16. The article of claim 15, wherein the non-transitory storage medium further stores instructions that cause the processor-based system to:
store within a memory register coupled to the word line, an address associated with the word line that has been accessed at least at the predetermined number of times within the refresh period.

17. The article of claim 16, the non-transitory storage medium further storing instructions readable by a processor-based system to:
flush the memory register upon resetting the analog circuit.

18. The article of claim 15, wherein the indication is received when an access rate of the word line associated with the memory device exceeds 3.1e6 accesses per 64 milliseconds.

19. The article of claim 15, the non-transitory storage medium further storing instructions readable by a processor-based system to:
combine, via the analog circuit, the alert with at least another alert associated with another memory row; and
transmit the combined alerts to a memory controller.

20. The article of claim 15, wherein the integrator determines that the respective word line has been accessed at least at the predetermined rate when the pulses associated with the positive transitions of the word line access signals exceed a predetermined threshold.

\* \* \* \* \*